United States Patent
Radin et al.

(10) Patent No.: US 10,284,939 B2
(45) Date of Patent: May 7, 2019

(54) HEADPHONES SYSTEM

(71) Applicant: Harman International Industries, Incorporated, Stamford, CT (US)

(72) Inventors: Daniel I. Radin, Waterford, CT (US); Kent Jopling, Tulsa, OK (US); Isword Zhang, Shenzhen (CN)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/690,371

(22) Filed: Aug. 30, 2017

(65) Prior Publication Data

US 2019/0069069 A1    Feb. 28, 2019

(51) Int. Cl.
G06F 3/16    (2006.01)
H04R 1/10    (2006.01)

(52) U.S. Cl.
CPC ........... H04R 1/1041 (2013.01); G06F 3/165 (2013.01); H04R 1/1008 (2013.01); H04R 2420/07 (2013.01)

(58) Field of Classification Search
CPC ........ H04R 1/1041; H04R 27/00; H04R 3/00; H04R 1/1008; H04R 2420/07
USPC ................ 381/74, 104, 110, 56, 57
See application file for complete search history.

(56) References Cited

U.S. PATENT DOCUMENTS

| | | | |
|---|---|---|---|
| 2002/0141597 A1* | 10/2002 | Wilcock | G06F 3/167 381/61 |
| 2007/0189544 A1 | 8/2007 | Rosenberg | |
| 2008/0159553 A1* | 7/2008 | Copley | G10K 11/178 381/71.1 |
| 2012/0140944 A1* | 6/2012 | Thiele | H04R 3/00 381/77 |
| 2014/0185828 A1* | 7/2014 | Helbling | H03G 5/165 381/103 |
| 2014/0270200 A1* | 9/2014 | Usher | H04R 1/1041 381/57 |
| 2014/0369527 A1* | 12/2014 | Baldwin | H03G 7/002 381/107 |
| 2015/0010156 A1* | 1/2015 | Chen | G10L 21/0205 381/56 |
| 2015/0222977 A1* | 8/2015 | Angel, Jr. | H04R 1/105 381/74 |
| 2015/0358730 A1* | 12/2015 | Kirsch | H04R 3/002 381/71.1 |

FOREIGN PATENT DOCUMENTS

| | | |
|---|---|---|
| EP | 2963647 A1 | 1/2016 |
| WO | 2014070825 A1 | 5/2014 |

OTHER PUBLICATIONS

Audio-Technica, ATH-ANC7b QuietPoint Instruction Manual, 2012, Audio-Technica, all pages pertinent.*

* cited by examiner

*Primary Examiner* — Paul Kim
*Assistant Examiner* — Ubachukwu A Odunukwe
(74) *Attorney, Agent, or Firm* — Brooks Kushman, P.C.

(57) ABSTRACT

A headphone listening device may include at least one speaker included in an earpiece and configured to playback first audio content from a first audio source. The headphone device may include at least one sensor configured to detect a trigger event and a controller. The controller may be configured to, in response to receiving the trigger event from the sensor, enable at least one microphone to acquire second audio content, fade a volume of the first audio content, and playback the second audio content.

10 Claims, 3 Drawing Sheets

HEADPHONES SYSTEM

TECHNICAL FIELD

Embodiments disclosed herein generally relate to a headphone system and method.

BACKGROUND

Headphones are often used by a user to listen to audio, typically while the user is performing other tasks, such as doing household chores, traveling, and working out. Headphones may typically include active or passive noise canceling technology configured to reduce unwanted outside sound and allow the user to better hear the audio emitting from the headphones.

SUMMARY

A headphone listening device may include at least one speaker included in an earpiece and configured to play back first audio content from a first audio source. The headphone device may include at least one sensor configured to detect a trigger event and a controller. The controller may be configured to, in response to receiving the trigger event from the sensor, enable at least one microphone to acquire second audio content, fade the volume of the first audio content, optionally cease playback of first audio content, and play the second audio content.

A headphone listening device may include at least one speaker included in an earpiece and configured to playback first audio content from a first audio source, at least one sensor configured to detect a trigger event including an interaction of a user with the at least one earpiece, and at least one microphone configured to detect ambient noise. The headphone device may also include a controller configured to fade and/or cease playback of the first audio content and initiate playback of second audio content based on the detected ambient noise by the microphone, in response to the trigger event.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

Figure 1:
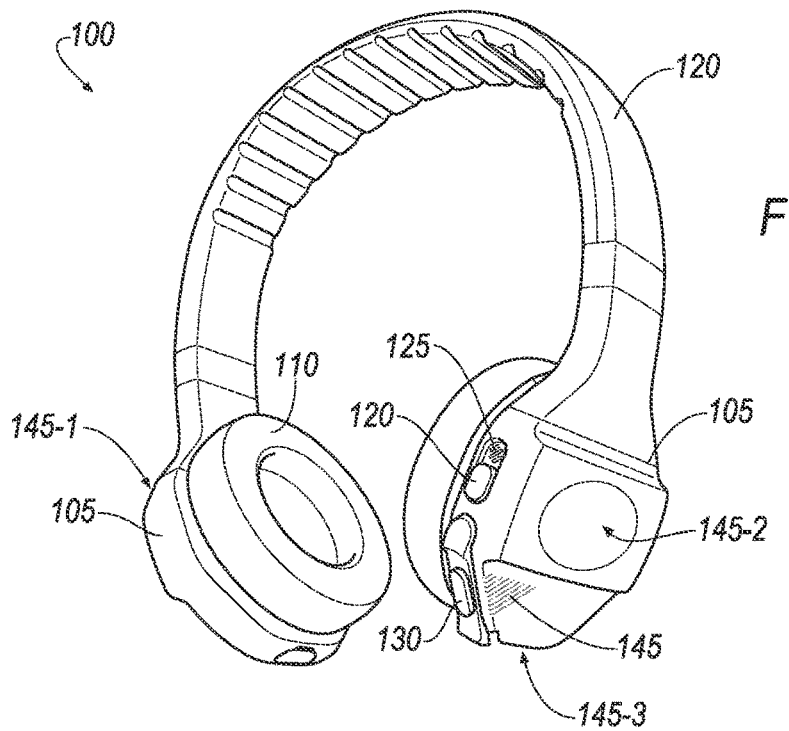
FIG. 1 illustrates a headphone listening device in accordance with one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Described herein is a headphone listening device programmed to selectively operate in one of a normal mode or talk through mode. In the normal mode, the headphones may operate normally, emitting audio content, often times audio content received via a wireless connection with a mobile device. For example, the user may listen to music while working out. However, often times the user wishes to pause the audio playback to listen to other audible sounds, such as human voice sounds. In one example situation, the user may be working out at a gym with his or her trainer. The user may wish to be able to hear the trainer's commands, while also enjoying his or her music. Passive or active noise cancellation can prevent outside noises, such as the voice of the trainer, from being audible to the user when the user is wearing the headphones. With existing systems, often times the user may slide an earpiece of the headphone off of his or her ear in order to hear the trainer. However, when working out, or performing other tasks, this can be cumbersome, uncomfortable and inconvenient.

The headphone device disclosed herein includes a talk through feature or mode that allows human voice sounds to selectively pass through the audio content being played by the headphones. In the talk through mode, the original audio content is paused or reduced in volume, and separate microphones pick up voices and emit these voices via the speakers in the headphones. That is, instead of pushing the earpiece from one's ear in order to hear a nearby person, the headphones allow the person's voice to be played through the speakers. The voice sounds picked up by the microphone are processed and filtered to provide a better listening experience to the user. Sounds other than voice sounds may also be passed through the speakers, such as music, sirens, etc. Thus, unlike existing systems, this dual-mode headphone system allows the user to hear outside noises without physically moving the headphones from his or her ears.

The user may activate and deactivate the talk through mode by initiating a trigger event. The trigger event may include any number of actions and is discussed in detail herein. In one example, the user may tap a button on the earpiece of the headphone. In another example, the trigger event may include an audible command spoken by the user. The trigger event may include the movement of a switch from an "off" position to an "on" position. Once the trigger event is recognized by the headphones, the headphones may fade the current audio playback, activate the microphones and gradually increase volume of the playback of the voice audio at the speakers. Thus, while the music is being faded to a low level or mute, the voice audio is being ramped up, creating a gradual, seamless, and unabrupt transition for the user. To deactivate the talk through mode and resume normal listening experiences, the user may simply initiate the trigger event again. The subsequent trigger event will cause the voice audio to fade, and resume and/or increase volume of playback from an optionally paused position of the original audio content.

FIG. 1 illustrates a headphone listening device 100, also referred to as "headphones 100". The headphones 100 include at least one speaker device 110, or "speakers 110". The headphones 100 may receive an audio signal from an audio device (not shown) for audio playback at the speakers 110. The audio device may be integrated into the headphones 100 and may also be a separate device configured to transmit the audio signal either via a hardwired connection such as a cable or wire and as well as via a wireless connection such as Bluetooth®. The audio device may be, for example, a mobile device such as a cell phone, tablet computer, iPod® or other portable music player, notebook or laptop, personal computer, wearable music-playing device, media server, etc.

In the example in FIG. 1, the headphones 100 include two earpieces 105 each housing at least one of the speaker devices 110 and being interconnected by a head support 120, or "support 120". The head support 120 may be a flexible or adjustable piece connecting the two speakers 110. The head support 120 may provide for support along a user's head to aid in maintaining the headphone's position during listening. Additionally, the head support 120 may be adjustable in that the length of the support 120 may be altered to fit a specific user's head. Although an over-the head version of headphones 100 are illustrated and disclosed herein, other forms of headphones, including various in-ear, around-ear, truly wireless in-ear, neck-worn, etc., headphones may be implemented.

The headphones 100 may include at least one microphone 145 configured to receive sound, or ambient audio signals. These ambient audio signals, also referred to herein as second audio signal and second audio content, may include ambient noise as well as audible sounds and commands from the user to another person. The microphone 145 may receive audible commands from the user. The microphone 145 may also receive audible sounds from a person nearby such as a friend, trainer, etc. who may be talking to the user.

The headphones 100 may also include a user interface 115, such as a switch or panel, configured to receive commands or feedback from the user. The interface 115 may include an LED 125 indicating a mode of the headphones 100 such as a Bluetooth® connection mode, talk through mode, a power mode (e.g., on or off), etc.

The interface 115 may include a switch 120 for switching between power on and power off. The switch 120 may also include a mode switch configured to switch between a normal mode and a talk through mode. The normal mode may include a mode whereby the user listens to first audio content provided by a first audio source, such as audio provided by the headphones or the mobile device. The talk through mode may include a mode whereby the user listens to the second audio content including ambient and environment noises in real time or near real time. The talk through mode is configured to enable the user to listen to nearby voices instead of the first audio content in response to a trigger event, the movement of the switch being one form of trigger. The talk through mode is discussed in more detail herein.

A volume control 130 may be configured to receive instructions relating to the volume level of the speakers 110 from the user. Further, the interface 115 and/or volume control 130 may be implemented at a device separate from the headphones 100 such as at a cellular phone, tablet, etc. In this example, the headphones 100 may communicate with the remote device via wireless communication facilitated via an application or other software on the device. For example, an application on a user's cellular phone may provide the interface 115 configured to provide commands to the headphones 100.

The headphones 100 may be powered by a re-chargeable or replaceable battery (not shown). In the example of the re-chargeable battery, the battery may be recharged via an external power source connectable via a Universal Serial Bus (USB) connection. The headphones 100 may also be charged by an AC wired power source such as a standard wall outlet.

Figure 2:
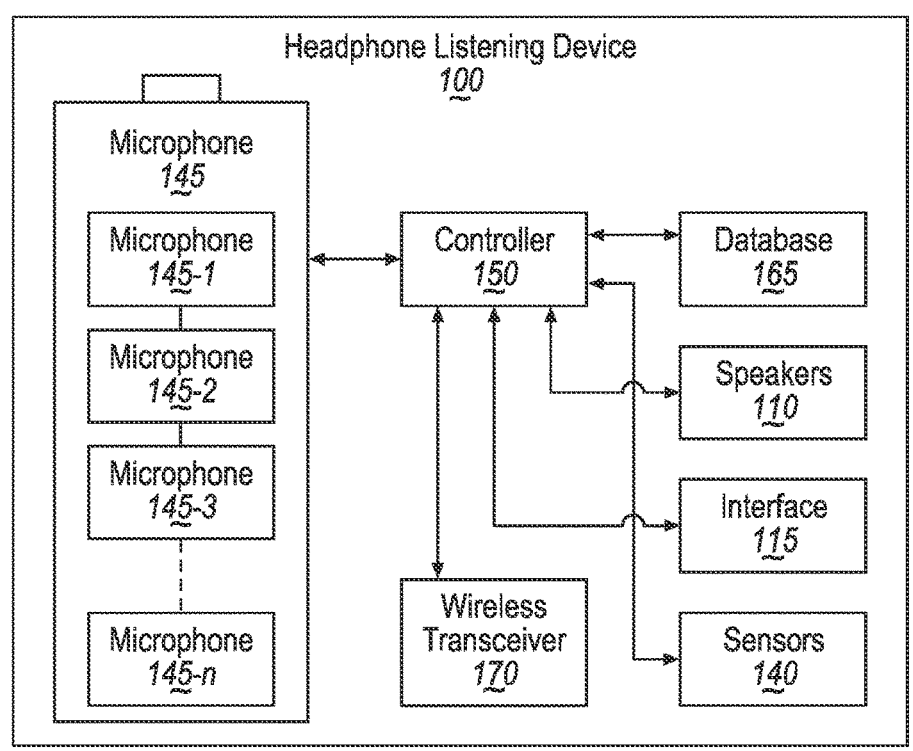
FIG. 2 illustrates a block diagram for the headphone listening device in accordance with one embodiment.

FIG. 2 illustrates a block diagram of the headphone device 100. The headphones 100 may include a controller 150 configured to facilitate the listening experience for the user. The controller 150 may be in communication with a database 165, the microphone 145, the user interface 115 and speakers 110. The controller 150 may also be in communication with a sensor 140 and a wireless transceiver 170.

The controller 150 may be a general or specific purpose processor configured to carry out the functions, processes and methods described herein. The controller 150 may receive data and signals from the various components including the database 165, microphone 145, user interface 115, speakers 110, transceiver 170, mobile devices, etc. The controller 150 may provide instructions to the speakers 110 regarding playback of the audio content and may interface with the mobile device. The controller 150 may perform various signal processing methods and processes on incoming audio signals to provide an enhanced listening experience to the user.

The transceiver 170 may be capable of receiving signals from remote devices, such as mobile devices and provide the first audio signals to the controller 150 for playback through the speakers 110. Other information and data may be exchanged via the transceiver 170 such as user settings, playlists, settings, etc. Communications between the headphones 100 and the remote device may be facilitated via a Bluetooth® wireless, or wired connection. Bluetooth® may be used to stream media content, such as music from the mobile device to the headphones 100 for playback. The controller 150 may include audio decoding capabilities for Bluetooth® technology.

The microphone 145 may include a plurality of microphones 145-1, 145-2. 145-3, 145-n. Each microphone 145 may provide the second audio signals to the controller 150. The second audio signals may include ambient noise, which may be analyzed by the controller 150. The controller 150 may adjust the audio output based on the input samples to provide for a better listening experience (e.g., background noise reduction or incoming speech clarity) as well as directional awareness for locating the incoming sound.

In one example, a first microphone 145-1 may be configured to provide a first audio input signal to the controller 150. This first audio input signal may include unwanted background noise. The controller 150 may use this first audio input signal for certain noise cancellation functions.

A second and a third microphone 145-2, 145-3 may also be included in the microphone 145. The second and third microphones 145-2, 145-3 may be arranged on the earpieces 105, similar to the microphone 145 of FIG. 1. In one example, each earpiece 105 may include one of the second and third microphones 145-2, 145-3. In another example, only one of the second and third microphones 145-2, 145-3 may be included. The second and third microphones 145-2, 145-3 may provide a second audio input signal to the controller 150. The second audio input signal may include audible noises such as audible sounds generated by a person's voice, for example, sounds in the 85-250 Hz frequency range. The controller 150 may use this second audio input for certain voice talk through features. These features and operation thereof are discussed in more detail herein.

The database 165 may be located locally within the headphones 100 and may include various equalization and signal processing properties including various look-up tables, compression, gain and filter settings, etc. These properties may be sued for active noise cancellation, signal processing, etc., of the various audio signals to provide for better playback of the same.

The sensor 140 may include sensors configured to detect a trigger event initiated by the user. The trigger event may include a user motion, impact, or gesture. In one example, the user motion may include a hand tap to the headphone. In another example, the user motion may include a nod of the head. The sensor 140 may detect these various user interactions and provide an indication of the trigger event to the controller 150.

In one example, the sensor 140 may include an acceleration sensor configured to detect an impact at the headphones 100. For example, the acceleration sensor may detect the tap to the earpiece 105 by the user. Upon a tap to the earpiece 105, the acceleration sensor may send an acceleration signal to the controller 150 indicating the tap.

In another example, the sensor 140 may include a gyroscope configured to determine an angle or change in angle of the headphones 100. The gyroscope may be configured to detect when a user shakes or nods his or her head. Upon a nod of the head, the gyroscope may send a gyroscope signal to the controller 150 indicating the change in angle, or nod of the head.

The sensor 140 may also include a touch, tactile, or pressure sensor configured to detect user interaction or pressure thereat. The touch sensor may include a touch screen configured to detect pressure, heat, resistance, etc. Upon touching the touch sensor, the touch sensor may send a touch signal to the controller 150 indicating the user contact.

The sensor 140 may further include a microphone configured to pick up audio commands by a user or other person. The microphone may include the microphone 145 or may be a distinct and separate microphone. The microphone may pick up on audible voice sounds (e.g., frequencies in the 85-250 Hz range) and may transmit the sounds to the controller 150. The controller may recognize certain sounds, either by the commands or by the voice tone. For example, the controller 150 may recognize the user's command "enter talk through mode," or "hi there" as well as the user's name spoken by another person. These phrases may trigger the controller 150 to initiate the talk though mode, for example.

In another example, the controller 150 may use voice recognition technology to recognize a specific voice of a user. For example, the controller 150 may recognize a person typically associated with a specific function, such as the user's personal trainer at a gym, for example. Upon recognizing the voice of the personal trainer, the controller 150 may subsequently initiate the talk through mode.

Such voice commands and voice recognition may be customizable by the user. For example, the user may set a specific word that may trigger the talk through mode. These custom settings may be implemented at the user device via an app or web-based authenticated system.

As explained above, a switch on the headphones 100 may also provide for an "on" position and an "off" position. Movement of the switch may constitute the trigger event for the purposes of changing modes.

Figure 3:
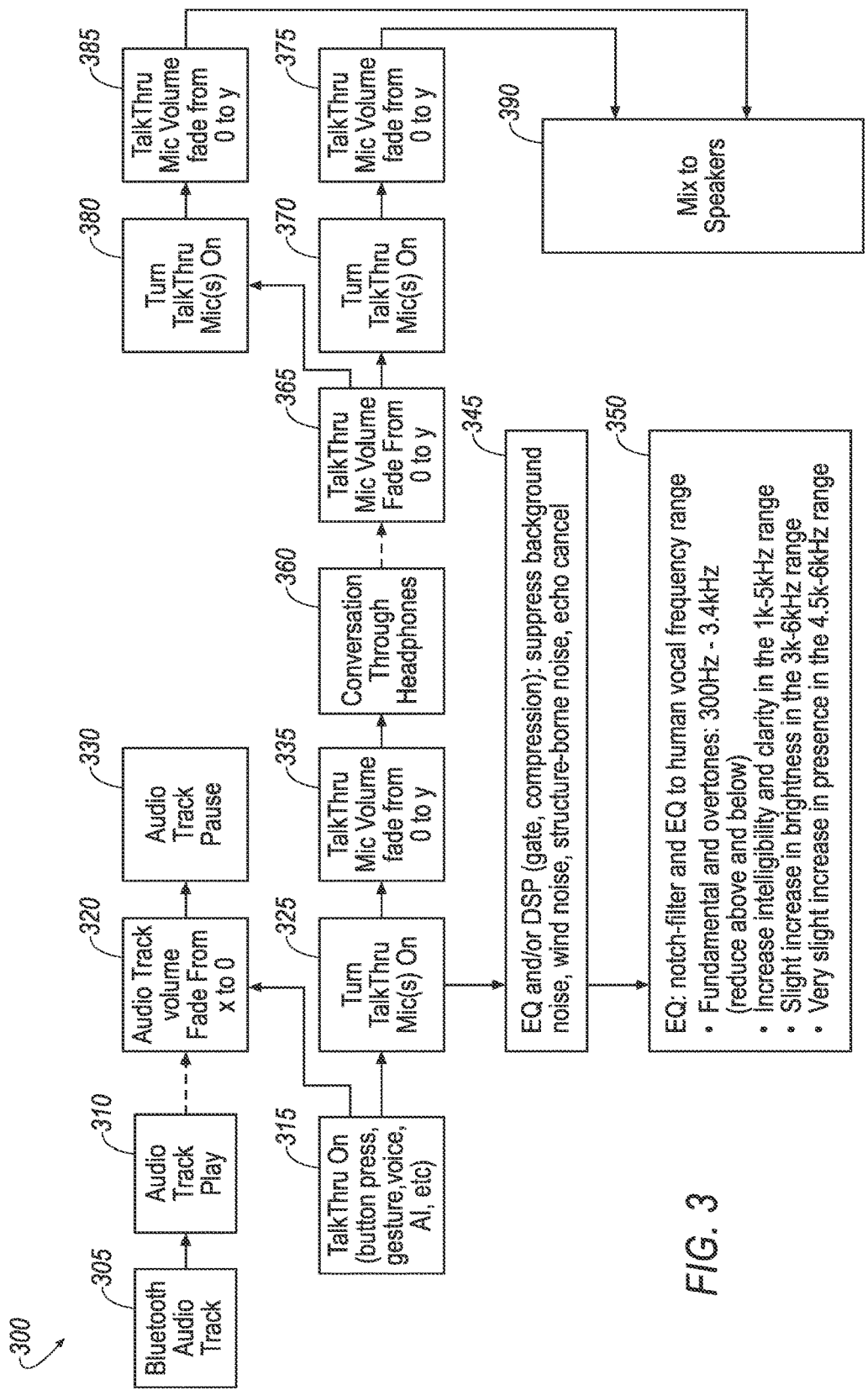
FIG. 3 illustrates a block diagram of a process of the headphone listening device in accordance with one embodiment.

FIG. 3 illustrates an example process diagram for the controller 150 to initiate, enter, and leave the talk though mode. The controller 150 may include a process 300 configured to activate and deactivate the talk through feature allowing the headphones 100 to operate in one of the normal mode and the talk through mode.

In one example, the process 300 may begin at block 305 where the headphones 100 may connect with the mobile device via the wireless or wired connection. At block 310, via the connection, the headphones may stream the first audio content via the speakers 110. As explained, the first audio content may include music or other audio content stored locally or otherwise provided via the mobile device via streaming, etc. During this normal mode, the headphones 100 may operate as expected, by playing audio content based on commands received at the headphones 100 or the mobile device to which it is paired.

In this normal mode, during playback of the first audio content, the user may wish to listen to, or be able to hear, ambient audio sounds. For example, the user may wish to listen to and partake in a conversation with another person. The user may also wish to hear ambient noises such as sirens, dogs, etc. The headphones 100 may provide the talk through feature in order to enable to the user to continuously be aware of, or selectively capture, these audio sounds outsides of the playback of the first audio content. To do this, the user may trigger the talk though feature. The talk through feature may be initiated by the talk through trigger event. The trigger event may include a switch of a button to an "on" position, a tap on the earpiece 105, an audible command, a tilt or nod of the head, etc.

These triggers may be communicated to the controller 150 via any one or more sensors (e.g. sensor 140) or other inputs, as described above with respect to FIG. 2. At block 315, the controller 150 may receive the trigger event. Once the controller 150 receives the trigger event, at block 320, the controller 150 may initiate the talk through feature by entering the talk through mode. Upon such initiation, the controller 150 may provide instructions to fade a volume of the first audio content from its current level to a decreased level. The decreased level may include a volume level less than the current level, such as a volume ten percent of the current level. The decreased volume level may also include a complete mute of the volume. The decreased volume level may be defined via a default value, and/or may be customizable by the user at the mobile device.

At block 330, the controller 150 may provide instructions to pause the first audio content once the volume level of the first audio content has reached the decreased volume level. That is, the playback of the first audio content may cease completely. The timestamp at which the playback ceases may be recorded so that the playback may be resumed at the same location once the headphones 100 leave the talk through mode.

At block 325, concurrently, or near concurrently, with the instructions provided at block 320, the controller 150 may also provide instructions to enable at least one of the microphones 145. In one example, the microphone or microphones specific to the talk through feature, e.g., the second and third microphones 145-2, 145-3, may be enabled. The second and third microphones 145-2, 145-3 may transmit the second audio input signal described above to the controller 150.

At block 345, the controller 150 may apply signal processing to the second audio signal. The signal processing may include applying various equalization, gate, compression, filters, etc., to suppress non-voice noise such as wind, background, echo, etc.

At block 350, the controller 150 may apply various notch filters and equalization to the human vocal frequency range. For example, these filters may increase intelligibility and clarity in the 1k-5 kHz range, increase brightness in the 3k-6 kHz range, as well as slightly increase presence in the 4.5k-6 kHz range.

At block 335, once the controller 150 has applied the appropriate processing and filters to the second audio input signal received at the second and third microphones 145-2, 145-3, the speakers 110 may playback a second audio content based on the processed second audio signal. The second audio content may include voice content from a person in near proximity to the user. The playback of the second audio content may gradually increase in volume until a certain level of volume is reached. This level of volume may be similar to that of the playback of the first audio content. As the volume of the first audio content is decreased, the volume of the second audio content is increased.

At block 360, the controller 150 continues to maintain the headphones 100 in the talk through mode. As explained, in this mode, the second audio content may be emitted by the speakers 110 allowing the user to hear a conversation without physically removing the earpiece 105 from his or her ear. The user is able to carry on with his or her activity, without further interacting with the headphones 100.

At block 365, the controller 150 may receive or recognize the subsequent trigger event. In one example, the subsequent trigger event may include switching the switch to the "off" position. In another example, the subsequent trigger event may be similar or identical to the first trigger event described with respect to block 315 such as a tap of the earpiece 105, and audible command, etc.

At block 370, the controller 150 may initiate the normal mode and provide instructions to fade a volume of the second audio content from its current level to a decreased volume level. The decreased volume level may include a volume level less than the current level. The decreased volume level may include a complete mute of the volume. By fading the volume, the volume of the second audio content may gradually decrease to zero.

At block 375, the controller 150 may provide instructions to disable at least one of the microphones 145. In one example, the microphone or microphones specific to the talk through feature, e.g., the second and third microphones 145-2, 145-3 may be disabled. By disabling the microphones when not in use, the headphones 100 may conserve power.

At block 380, the controller 150 may provide instructions to continue or resume playback of the first audio content. This may include un-pausing the audio playback at the time stamp at which the first audio content was paused at block 330.

At block 385, the controller 150 may gradually increase the volume of the playback of the first audio content until a certain level of volume is reached. This level of volume may be similar to that of the playback of the first audio content prior to initiation of the talk through mode. As the volume of the second audio content is decreased at block 370, the volume of the first audio content is increased.

At block 390, the controller 150 maintains a normal mode, allowing the first audio content to be played via the speakers 110.

Figure 4:
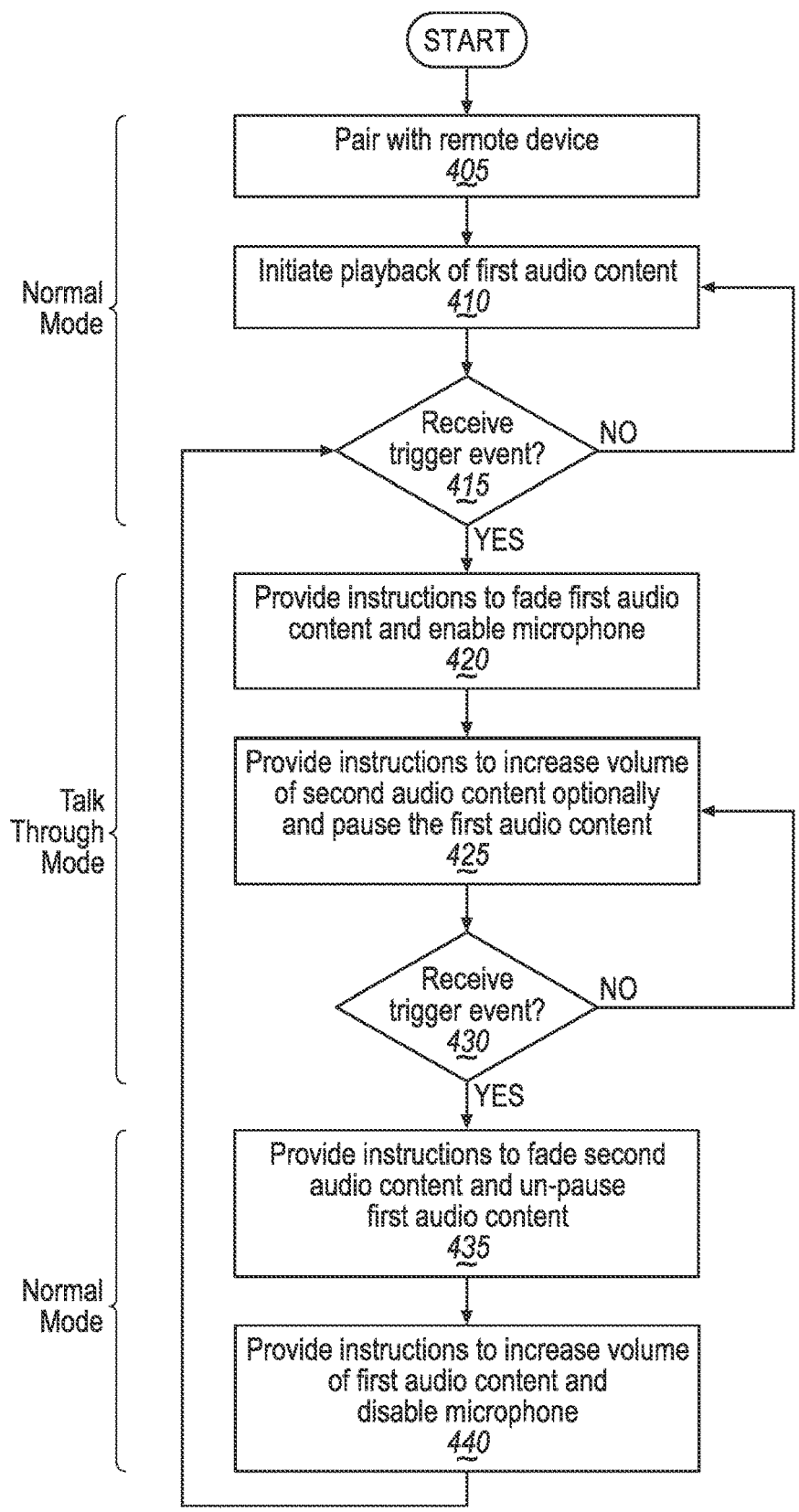
FIG. 4 illustrates a process flow of the headphone listening device in accordance with one embodiment.

FIG. 4 illustrates a process flow of the headphone listening device in accordance with one embodiment. The process 400 may begin at block 405 where the controller 150 may pair with the remote device in order to transmit data therebetween including the first audio content.

At block 410, the controller 150 may initiate playback of the first audio content via the speakers 110.

At block 415, the controller 150 may determine whether the trigger event has been recognized. As explained, the trigger event may include an action by the user to change between the normal mode and the talk through mode. If the trigger event has been recognized, the process 400 proceeds to block 420. If not, the process 400 proceeds to block 410 and the headphones continue to operate in the normal mode.

At block 420, the controller 150 may provide instructions to fade the volume of the first audio content and enable at least one microphone 145.

At block 425, the controller 150 may provide instructions to increase the volume of the second audio content provided by the microphone 145 to a certain volume while optionally pausing the playback of the first audio content. Thus, as the first audio content is gradually faded and paused, the second audio content volume is increased. The headphones 100 are thus operating in the talk through mode.

At block 430, the controller 150 may determine whether the subsequent trigger event has been recognized. As explained, the subsequent trigger event may include an action by the user to return to the normal mode. If the subsequent trigger event has been recognized, the process 400 proceeds to block 435. If not, the process 400 proceeds to block 425 and the headphones continue to operate in the talk through mode.

At block 435, the controller 150 may provide instructions to fade the volume of the second audio content and un-pause the first audio content if it had been paused at block 425.

At block 440, the controller 150 may provide instructions to increase the volume of the first audio content a certain volume while disabling the microphone 145. Thus, as the second audio content is gradually faded and disabled, the first audio content volume is increased. The headphones 100 are thus no longer operating in the normal mode.

While the above examples disclose various situation relating to muting the first audio content. In another example, instead of a complete talk through mode, a conversation mode may be entered in response to the trigger event. In this mode, which may be customizable, a certain portion or volume of the first audio content may remain. That is, the first audio content may continue to playback at the speakers 110, though at a lesser volume level than that of the second audio content. For example, instead of pausing the first audio content, the volume may simply be decreased to 10% of the original volume. The second audio content may make up approximate 90% of the original volume level.

To the same extent, a spatial awareness mode may also be entered. This mode may allow users to hear ambient noises such as sirens, whistles, traffic, etc. In this example, instead of specifically filtering out the voice audio (e.g., as in blocks 345 and 350), other sounds may be filtered, or passed through to the user.

Accordingly, described herein is a method and apparatus for permitting a talk through mode, which allows headphones to gradually mute playback of audio content and allow voice sounds to pass through the speakers. This allows a user to carry on a conversation without physically removing one or both earpieces 105 from his or her ear.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A headphone listening device, comprising:
    at least one speaker included in an earpiece and configured to playback first audio content from a first audio source;
    at least one switch configured to detect a trigger event, the trigger event including a change in the switch; and
    a controller configured to, in response to receiving the trigger event from the switch:
        enable at least one microphone to acquire second audio content including ambient noise;
        fade a volume of the first audio content over time to a mute to allow for playback of the second audio content instead of the first audio content; and
        playback the second audio content;
    wherein the sensor is configured to receive a subsequent trigger event from the sensor and the controller is configured to, in response to receiving the subsequent trigger event from the switch:
        fade a volume of the second audio content;
        disable the microphone; and
        resume playback the first audio content.

2. The device of claim 1, wherein the at least one switch is further configured to detect a user interaction with the earpiece, the trigger event including the user interaction.

3. The device of claim 1, wherein the playback of the second audio content includes a gradual increase in volume over time of the second audio content.

4. The device of claim 1, wherein the fade of the volume of the first audio content occurs concurrently with the playback of the second audio content.

5. The device of claim 1, wherein the controller is further configured to fade the volume of the second audio content to a mute.

6. The device of claim 1, wherein the fade of the volume of the second audio content occurs concurrently with the playback of the first audio content.

7. A headphone listening device, comprising:
    at least one speaker included in an earpiece and configured to playback first audio content from a first audio source;
    at least one sensor including at least one switch configured to detect a change in the switch for switching playback of the first audio content to a second audio content including ambient noise;
    at least one microphone configured to detect the ambient noise; and
    a controller configured to:
    cease playback of the first audio content and initiate playback of a second audio content based on the detected ambient noise by the microphone, in response to the change in the switch; and
        enable the at least one microphone to acquire the ambient noise, fade a volume of the first audio content, and resume playback of the second audio content, in response to detecting another change in the switch.

8. The device of claim 7, wherein the controller is further configured to fade the volume of the first audio content to a mute.

9. The device of claim 7, wherein the playback of the second audio content includes a gradual increase in volume over time of the second audio content.

10. The device of claim 7, wherein the fade of the volume of the first audio content occurs concurrently with the playback of the second audio content.

* * * * *